(12) United States Patent
Besser et al.

(10) Patent No.: US 7,402,207 B1
(45) Date of Patent: Jul. 22, 2008

(54) METHOD AND APPARATUS FOR CONTROLLING THE THICKNESS OF A SELECTIVE EPITAXIAL GROWTH LAYER

(75) Inventors: Paul R. Besser, Sunnyvale, CA (US); Eric N. Paton, Morgan Hill, CA (US); William G. En, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 352 days.

(21) Appl. No.: 10/839,378

(22) Filed: May 5, 2004

(51) Int. Cl.
*C30B 21/04* (2006.01)

(52) U.S. Cl. .......................... 117/85; 117/86; 117/201; 117/202; 118/715

(58) Field of Classification Search .................. 117/201, 117/202, 85, 86; 118/715
See application file for complete search history.

(56) References Cited

U.S. PATENT DOCUMENTS

| | | | |
|---|---|---|---|
| 4,606,866 A | 8/1986 | McGlothlin et al. | |
| 4,868,617 A | 9/1989 | Chiao et al. | |
| 4,877,757 A | 10/1989 | York et al. | |
| 4,933,295 A | 6/1990 | Feist | |
| 5,091,763 A | 2/1992 | Sanchez | |
| 5,180,464 A | 1/1993 | Tatsumi et al. | |
| 5,298,454 A * | 3/1994 | D'Asaro et al. | 117/86 |
| 5,319,232 A | 6/1994 | Pfiester | |
| 5,387,309 A * | 2/1995 | Bobel et al. | 117/85 |
| 5,556,462 A * | 9/1996 | Celii et al. | 117/85 |
| 5,646,073 A | 7/1997 | Grider et al. | |
| 5,670,018 A | 9/1997 | Eckstein et al. | |
| 5,677,214 A | 10/1997 | Hsu | |
| 5,696,012 A | 12/1997 | Son | |
| 5,710,450 A | 1/1998 | Chau et al. | |
| 5,773,328 A | 6/1998 | Blanchard | |
| 5,854,136 A | 12/1998 | Huang et al. | |
| 5,902,125 A | 5/1999 | Wu | |
| 5,926,701 A | 7/1999 | Li | |
| 5,953,609 A | 9/1999 | Koyama et al. | |
| 5,956,590 A | 9/1999 | Hsieh et al. | |
| 6,017,779 A | 1/2000 | Miyasaka | |

(Continued)

FOREIGN PATENT DOCUMENTS

JP 06326049 A 11/1994

OTHER PUBLICATIONS

Besser et al., "Silicides for the 65nm Technology Node," MRS Symposium Proc. 766 (2003), Technology Development Group, Advanced Micro Devices, Inc., Austin, Texas.

(Continued)

*Primary Examiner*—Robert M Kunemund (57) ABSTRACT

Methods and systems for permitting thickness control of the selective epitaxial growth (SEG) layer in a semiconductor manufacturing process, for example raised source/drain applications in CMOS technologies, are presented. These methods and systems provide the capability to measure the thickness of an SEG film in-situ utilizing optical ellipsometry equipment during or after SEG layer growth, prior to removing the wafer from the SEG growth tool. Optical ellipsometry equipment can be integrated into the SEG platform and control software, thus providing automated process control (APC) capability for SEG thickness. The integration of the ellipsometry equipment may be varied, dependent upon the needs of the fabrication facility, e.g., integration to provide ellipsometer monitoring of a single process tool, or multiple tool monitoring, among other configurations.

12 Claims, 6 Drawing Sheets

U.S. PATENT DOCUMENTS

| | | | |
|---|---|---|---|
| 6,024,794 A * | 2/2000 | Tamamura et al. ............ 117/85 |
| 6,074,939 A | 6/2000 | Watanabe |
| 6,077,076 A | 6/2000 | Comfort |
| 6,124,610 A | 9/2000 | Cheek et al. |
| 6,133,093 A | 10/2000 | Prinz et al. |
| 6,143,036 A | 11/2000 | Comfort |
| 6,159,422 A | 12/2000 | Graves et al. |
| 6,165,826 A | 12/2000 | Chau et al. |
| 6,165,857 A | 12/2000 | Yeh et al. |
| 6,165,906 A | 12/2000 | Bandyopadhyay |
| 6,187,645 B1 | 2/2001 | Lin et al. |
| 6,190,981 B1 | 2/2001 | Lin et al. |
| 6,214,049 B1 | 4/2001 | Gayer et al. |
| 6,228,730 B1 | 5/2001 | Chen et al. |
| 6,228,746 B1 | 5/2001 | Ibok |
| 6,235,568 B1 | 5/2001 | Murthy et al. |
| 6,245,684 B1 | 6/2001 | Zhao et al. |
| 6,251,764 B1 | 6/2001 | Pradeep et al. |
| 6,255,152 B1 | 7/2001 | Chen |
| 6,271,572 B1 | 8/2001 | Fujita |
| 6,277,700 B1 | 8/2001 | Yu et al. |
| 6,277,736 B1 | 8/2001 | Chen et al. |
| 6,284,662 B1 | 9/2001 | Mikagi |
| 6,294,432 B1 | 9/2001 | Lin et al. |
| 6,303,447 B1 | 10/2001 | Chhagan et al. |
| 6,313,017 B1 | 11/2001 | Varhue |
| 6,316,302 B1 | 11/2001 | Cheek et al. |
| 6,335,251 B2 | 1/2002 | Miyano et al. |
| 6,346,447 B1 | 2/2002 | Rodder |
| 6,346,468 B1 | 2/2002 | Pradeep et al. |
| 6,346,505 B1 | 2/2002 | Morita et al. |
| 6,348,387 B1 | 2/2002 | Yu |
| 6,380,043 B1 | 4/2002 | Yu |
| 6,383,877 B1 | 5/2002 | Ahn et al. |
| 6,387,765 B2 | 5/2002 | Chhagan et al. |
| 6,403,434 B1 | 6/2002 | Yu |
| 6,436,841 B1 | 8/2002 | Tsai et al. |
| 6,440,851 B1 | 8/2002 | Agnello et al. |
| 6,444,578 B1 | 9/2002 | Cabral et al. |
| 6,451,693 B1 | 9/2002 | Woo et al. |
| 6,461,385 B1 | 10/2002 | Gayer et al. |
| 6,472,283 B1 | 10/2002 | Ishida et al. |
| 6,479,358 B1 | 11/2002 | Yu |
| 6,596,138 B2 | 7/2003 | Shibasaki |
| 6,677,233 B2 | 1/2004 | Dubin |
| 6,679,946 B1 * | 1/2004 | Jackson et al. ................. 117/84 |
| 6,713,350 B2 | 3/2004 | Rudeck |
| 6,726,767 B1 * | 4/2004 | Marrs et al. ................... 117/85 |
| 6,727,553 B2 | 4/2004 | Kotani |
| 6,777,759 B1 | 8/2004 | Chau et al. |
| 6,800,213 B2 | 10/2004 | Ding et al. |
| 6,890,391 B2 | 5/2005 | Aoki et al. |
| 6,908,822 B2 | 6/2005 | Rendon et al. |
| 6,924,518 B2 | 8/2005 | Iinuma et al. |
| 6,946,371 B2 | 9/2005 | Langdo et al. |
| 6,979,622 B1 | 12/2005 | Thean et al. |
| 7,008,835 B2 | 3/2006 | Jin et al. |
| 7,014,788 B1 | 3/2006 | Fujimura et al. |
| 7,018,891 B2 | 3/2006 | Doris et al. |
| 7,037,793 B2 | 5/2006 | Chien et al. |
| 7,176,522 B2 | 2/2007 | Cheng et al. |
| 7,183,662 B2 | 2/2007 | Kim et al. |
| 7,235,848 B2 | 6/2007 | Jeng |
| 7,241,700 B1 | 7/2007 | En et al. |
| 2001/0012693 A1 | 8/2001 | Talwar et al. |
| 2002/0104846 A1 | 8/2002 | Shinasaki |
| 2002/0135017 A1 | 9/2002 | Vogt et al. |
| 2002/0137297 A1 | 9/2002 | Kunikiyo |
| 2002/0142616 A1 | 10/2002 | Giewont et al. |
| 2002/0171107 A1 | 11/2002 | Cheng et al. |
| 2003/0038323 A1 | 2/2003 | Kotani |
| 2003/0042515 A1 | 3/2003 | Xiang et al. |
| 2003/0098479 A1 | 5/2003 | Murthy et al. |
| 2003/0124840 A1 | 7/2003 | Dubin |
| 2004/0041216 A1 | 3/2004 | Mori et al. |
| 2004/0053484 A1 | 3/2004 | Chakravarthi et al. |
| 2004/0118812 A1 | 6/2004 | Watkins et al. |
| 2004/0119102 A1 | 6/2004 | Chan et al. |
| 2004/0132291 A1 | 7/2004 | Lee et al. |
| 2005/0112817 A1 | 5/2005 | Cheng et al. |
| 2005/0118769 A1 | 6/2005 | Kammler et al. |
| 2005/0121719 A1 | 6/2005 | Mori |
| 2005/0124126 A1 | 6/2005 | Wu |
| 2005/0130434 A1 | 6/2005 | Chien et al. |
| 2005/0153566 A1 | 7/2005 | Han et al. |
| 2005/0176205 A1 | 8/2005 | Chien et al. |
| 2005/0212015 A1 | 9/2005 | Huang et al. |
| 2005/0252443 A1 | 11/2005 | Tsai et al. |
| 2006/0094215 A1 | 5/2006 | Frohberg et al. |
| 2006/0099766 A1 | 5/2006 | Jin et al. |
| 2006/0131648 A1 | 6/2006 | Ahn et al. |
| 2006/0151776 A1 | 7/2006 | Hatada et al. |
| 2006/0151840 A1 | 7/2006 | Maekawa |
| 2006/0154410 A1 | 7/2006 | Choi et al. |
| 2006/0175686 A1 | 8/2006 | Murata et al. |
| 2006/0202237 A1 | 9/2006 | Huang et al. |
| 2006/0252191 A1 | 11/2006 | Kammler et al. |
| 2006/0281271 A1 | 12/2006 | Brown et al. |
| 2007/0042602 A1 | 2/2007 | Watkins et al. |
| 2007/0057324 A1 | 3/2007 | Tews et al. |
| 2007/0132013 A1 | 6/2007 | Banerjee et al. |
| 2007/0166937 A1 | 7/2007 | Adetutu et al. |

OTHER PUBLICATIONS

Branebjerg et al. "Dopant Selective HF Anodic Etching of Silicon," Mesa-Institute, University of Twente, 1991 IEEE, pp. 221-226, Enschede, The Netherlands.

Chau et al., "A 50nm Depleted-Substrate CMOS Transistor (DST)," 2001 IEEE, Intel Corporation, Hillsboro, Oregon.

Cohen et al., "a Self-Aligned Silicide Process Utilizing ION Implants for Reduced Silicon Consumption And Control of the Silicide Formation Temperature," vol. 716, 2002 Materials Research Society, pp. BI.7.1-BI.7.6, Yorktown Heights, New York.

Ghani et al., "A 90 nm High Volume Manufacturing Logic Technology Featuring Novel 45nm Gate Length Strained Silicon CMOS Transistors," 2003 IEEE, 3 pages.

Nojiri et al. "Bias-Dependent Etching of Silicon In Aqueous Ammonia," Central Engineering Lab. Nissan Motor Co., 1991 IEEE, pp. 136-139, Yokosuka, Japan.

Van Den Meerakker et al., "A Mechanistic tudy of Silicon Etchingin NH3/H2O2 Cleaning Solutions," Philips Research Lab., J. Electrochem. Soc., vol. 137, No. 4, pp. 1239-1243, Eindhoven, The Netherlands.

Van Meer et al., "70 nm Fully-Depleted SOI CMOS Using A New Fabrication Scheme: The Spacer/Replacer Scheme," IMEC, Leuven, Belgium.

Wang et al., "Selective Etching of N-Type silicon Using Pulsed Potential Anodization," General Motors Research Lab., 1991 IEEE, pp. 819-822, Warren, Michigan.

Wolf et al., "Silicon Processing for the VLSI Era vol. 1: Process Technology", ISBN 0-961672-3-7, University of California, Sunset Beach, California, pp. 521-542.

U.S.P.T.O Actions on the Merits as of Oct. 17, 2007, 6 pages.

Actions on the Merits by U.S.P.T.O. as of Feb. 18, 2008, 7 pages.

* cited by examiner

METHOD AND APPARATUS FOR CONTROLLING THE THICKNESS OF A SELECTIVE EPITAXIAL GROWTH LAYER

FIELD OF THE DISCLOSURE

The present disclosure relates generally to a semiconductor manufacturing process and system, and more particularly to process control during a semiconductor manufacturing processes.

DESCRIPTION OF THE RELATED ART

Selective epitaxial growth (SEG) processes for raised source/drain applications in complementary metal oxide semiconductor (CMOS) technologies are increasingly being utilized in the semiconductor industry. One key consideration during SEG processing is obtaining uniformity in a desired thickness of the SEG layer during formation. A typical desired SEG thickness is on the order of 200 Angstroms. A variation of 100 Angstroms from wafer to wafer can result in decreased device performance. For example, if an SEG layer is too thick, bridging from the source/drain area to the gate across the spacer following silicidation may result. Alternately, when an SEG layer is too thin, junction leakage and excessive contact resistance may result following silicidation.

In a typical fabrication facility, after an SEG layer is grown on a wafer in a SEG process chamber, the wafer is removed from the tool containing the SEG process chamber to have the thickness of the SEG layer measured. Once the wafer is removed from the tool, oxidation may occur on the surface of the SEG layer due to differences in environmental conditions between the SEG tool and regions outside the SEG process chamber. Thus if measurements determine the SEG layer is of insufficient thickness, the wafer generally must undergo an additional cleaning process to remove the oxidation prior to additional SEG growth, since SEG growth does not occur on oxidized surfaces.

Therefore, a method that addresses the problems associated with monitoring the thickness of an SEG layer would be useful.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present disclosure provides methods and systems for permitting thickness control of the selective epitaxial growth (SEG) layer in a semiconductor manufacturing process, for example raised source/drain (S/D) applications in CMOS technologies. The methods and systems presented provide the capability to measure the thickness of the SEG film in-situ utilizing optical ellipsometry equipment during or after SEG layer growth, prior to removing the wafer from the SEG growth tool or process chamber(s). In the various embodiments, an ellipsometer is integrated into the SEG platform and control software, thus providing automated process control (APC) capability for SEG thickness.

Because the measurement tool is integrated into the SEG platform, the problem of problem of potential oxidation on the surface of an SEG layer resulting from differences in environmental conditions between the SEG tool and regions outside the SEG process chamber is overcome. The integration of the ellipsometry equipment may be combined in various ways, dependent upon the needs of the fabrication facility, e.g., integration to provide ellipsometer monitoring of a single process tool, or multiple tool monitoring, among other arrangements which are presented herein.

In the various embodiments taught herein, the use of metrology monitor boxes is a specific embodiment. These metrology monitor boxes, which may be located in the scribe line to save die space, are typically a 50 micron by 50 micron size for optical ellipsometry equipment. The metrology boxes typically match the sampling area of the optical ellipsometry equipment. In various embodiment of the present disclosure, the integrated tools presented herein can utilize automatic alignment (no operator adjustments) with techniques such as digital optical recognition and pixel subtraction, as well as other alignment techniques, in order to position the metrology monitor box within the sampling area of the optical ellipsometry equipment.

Figure 1:
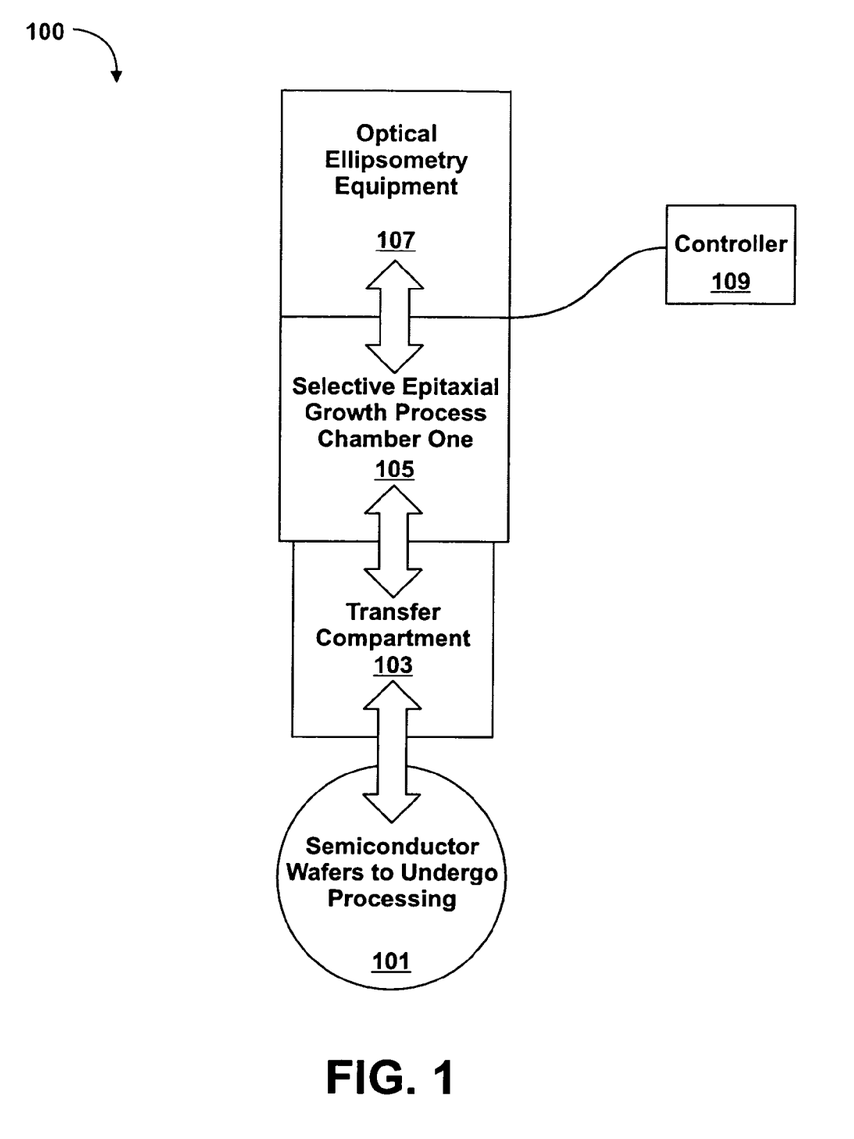
FIG. 1 is a simplified block diagram showing a system for integrating optical ellipsometry equipment onto a selective epitaxial growth (SEG) platform according to at least one embodiment of the present disclosure.

FIG. 1 is a simplified block diagram illustrating an integrated process tool 100 in which semiconductor wafer substrates 101 to undergo processing are inserted into a transfer compartment 103 prior to placement into a first process chamber, e.g., SEG process chamber 105. The processes to be conducted in integrated process tool 100 can be monitored and/or controlled by controller 109. While in SEG process chamber 105, the semiconductor wafer substrates 101 have a first epitaxial layer formed. Following formation of the first epitaxial layer, substrates 101 are removed from the SEG process chamber 105 and placed in a second process chamber 107. In a specific embodiment, the second process chamber 107 is an optical ellipsometry equipment chamber 107.

While in the second process chamber 107, a thickness of the first epitaxial layer of substrates 101 is measured and compared to a desired thickness. The steps of measuring and comparing are typically performed for a plurality of locations of the first epitaxial layer of the substrates 101.

When the thickness comparison has been conducted, if the desired thickness is greater than the thickness of the first epitaxial layer of the substrates 101, the substrates 101 are returned to the first epitaxial growth chamber 105. A second SEG layer growth process would then occur in the SEG chamber 105, and the steps of removing, placing, measuring, and comparing can be conducted until the desired thickness has been met. Alternately, when the desired thickness is at or less than the thickness of the first epitaxial layer, no further SEG growth is necessary, hence the substrates 101 could be transferred to the transfer compartment 103 for removal from the integrated process tool 100 for further fabrication toward device completion.

In the various embodiments, no cleaning of the semiconductor substrates 101 is required between placing the substrates 101 in the second process chamber 107 and returning the substrates 101 to the SEG process chamber 103 prior to the step of returning. This is because a low-pressure atmosphere is maintained at the semiconductor substrates 101 during the steps of forming the first epitaxial layer, removing, and placing the substrates 101 in the second process chamber 107 of integrated process tool 100. In addition, a low-pressure atmosphere is also maintained during the step of returning the substrates 101 from the second chamber 107 to the first chamber 105. In an embodiment, the low-pressure atmosphere is in the range of $1\times10^{-6}$ to $1\times10^{-10}$ Torr.

Controller 109 represents an information handling system which is interfaced to processing tool 100. Controller 109 can interface to a communications port (not shown) to receive measurements from the optical ellipsometer in the second process chamber 107. Although not specifically illustrated, controller 109 further comprises a processor, memory operably coupled to said processor, and a program of instructions to be stored in memory and executed by said processor. The program of instructions includes instructions to compare the thickness of the epitaxial layer and a desired thickness. The program of instructions further includes instructions to halt the selective epitaxial growth process when the thickness of the epitaxial layer is substantially equal to the desired thickness.

The measurement data obtained from the controller 109 can also be utilized to evaluate a semiconductor manufacturing process based on the thickness of the first epitaxial layer grown in SEG chamber 105. This information could then be utilized in process control to adjust the SEG parameters of chamber 105 such that the desired thickness is obtained for the first epitaxial layer, without having to resort to multiple SEG layer growing processes, saving time.

Alternately, embodiments of the method disclosed herein permits in-situ measurements wherein the optical ellipsometry equipment is measuring the growth of the epitaxial layer while the SEG process is occurring, e.g., no wafer conveyance to chamber 107. In this embodiment, illustrated in detail in FIG. 6, the program of instructions in controller 109 would further include instructions to halt the SEG process when the thickness of the epitaxial layer is substantially equal to the desired thickness. Similarly, measurement data obtained from controller 109 can be utilized to evaluate a semiconductor manufacturing process based on the measured thickness of the epitaxial layer grown in SEG chamber 105. This information could be utilized in advanced process control to adjust the SEG parameters during epitaxial layer growth.

Figure 2:
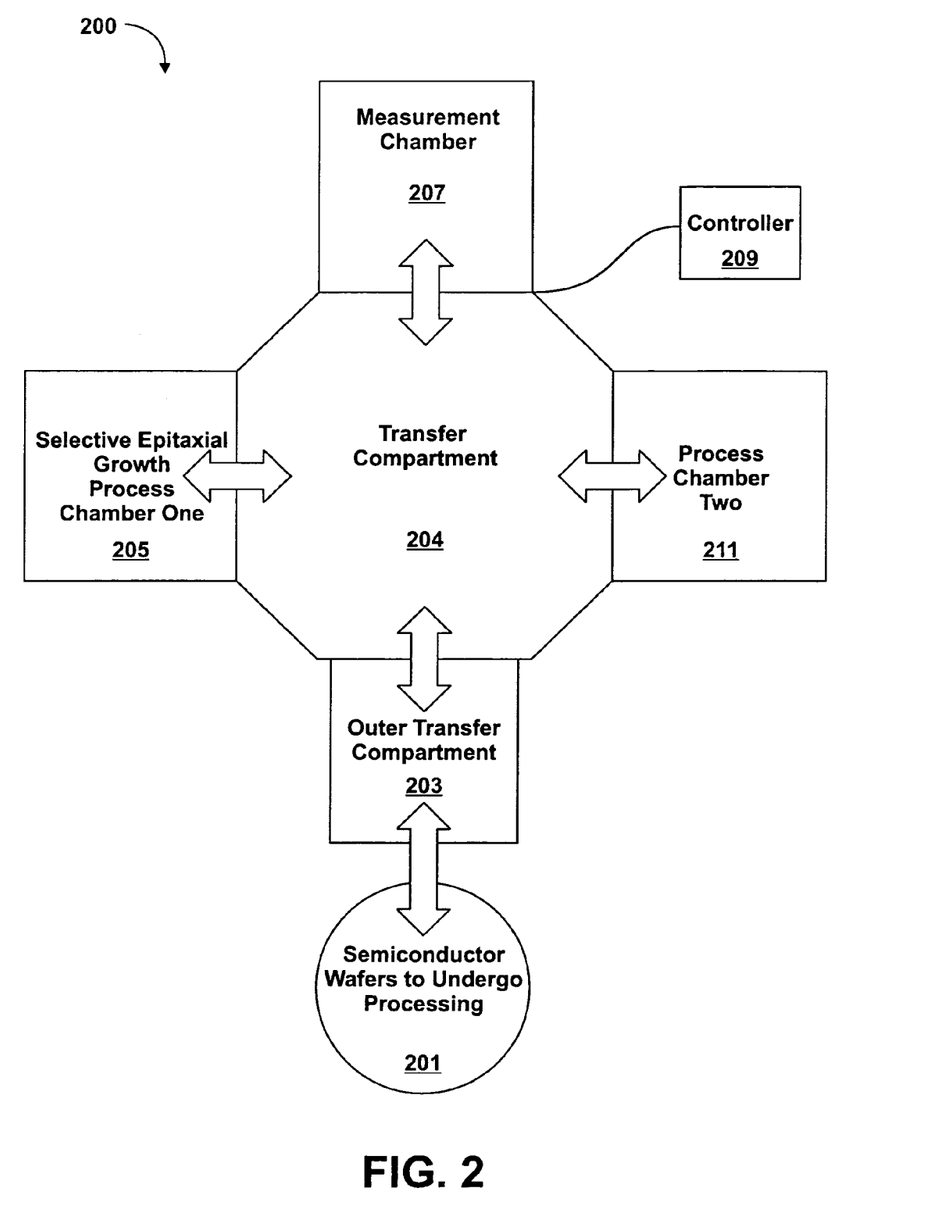
FIG. 2 is a simplified block diagram showing an arrangement for integrating optical ellipsometry equipment onto a multiple process platform according to at least one embodiment of the present disclosure.

FIG. 2 is a simplified block diagram illustrating another example of a configuration for an integrated semiconductor device processing tool 200. Integrated processing tool 200 comprises an outer transfer compartment 203, an inter-chamber transfer compartment 204, an SEG process chamber 205, a measurement chamber 207, another process chamber 211, and a controller 209. In an embodiment, the measurement chamber 207 uses an optical ellipsometer to measure a thickness of an epitaxial layer. The process chamber 211 may be an additional SEG process chamber, or another type of process such as a rapid thermal annealing (RTA) chamber.

Semiconductor wafer devices 201 are placed in the outer transfer compartment 203 to begin the portion of the fabrication cycle to be conducted with integrated semiconductor device processing tool 200. From the outer transfer compartment 203, the devices 201 to undergo processing are inserted into an inter-chamber transfer compartment 204 prior to placement into a first process chamber, e.g., SEG process chamber 205. Conveyance of devices 201 between the process chambers 205, 207, and 211 can be accomplished by the inter-chamber transfer compartment 204 with the aid of various robotic devices (not shown), which are well known in the art.

In a typical flow from the inter-chamber transfer compartment 204, the devices 201 are removed from the transfer compartment 204 and placed into the SEG chamber 205 to initiate an epitaxial layer growth process. Inter-chamber transfer compartment 204 is utilized to remove wafers 201 from the SEG process chamber 205 and place the wafers 201 into the measurement chamber 207. Inter-chamber transfer compartment 204 is operable to maintain a pressure which is substantially the same pressure as exists in the SEG process chamber 205 during processing. In addition, substantially the same pressure as exists in the SEG process chamber is maintained in the measurement chamber 207. Maintaining the same (low) pressure is antithetical for oxidation, thus negating the requirement to clean the devices 201 between movements to/from measurement chamber 207 to/from SEG process chamber 205.

Controller 209 represents an information handling system which is interfaced to processing tool 200. Controller 209 can interface to a communications port (not shown) to receive measurements from the optical ellipsometer in the measurement chamber 207. Although not illustrated, controller 209 further comprises a processor, memory operably coupled to said processor, and a program of instructions to be stored in memory and executed by said processor. The program of instructions includes instructions on a computer-readable medium to compare the thickness of the epitaxial layer at a plurality of measurement locations on devices 201 and a desired thickness.

Figure 3:
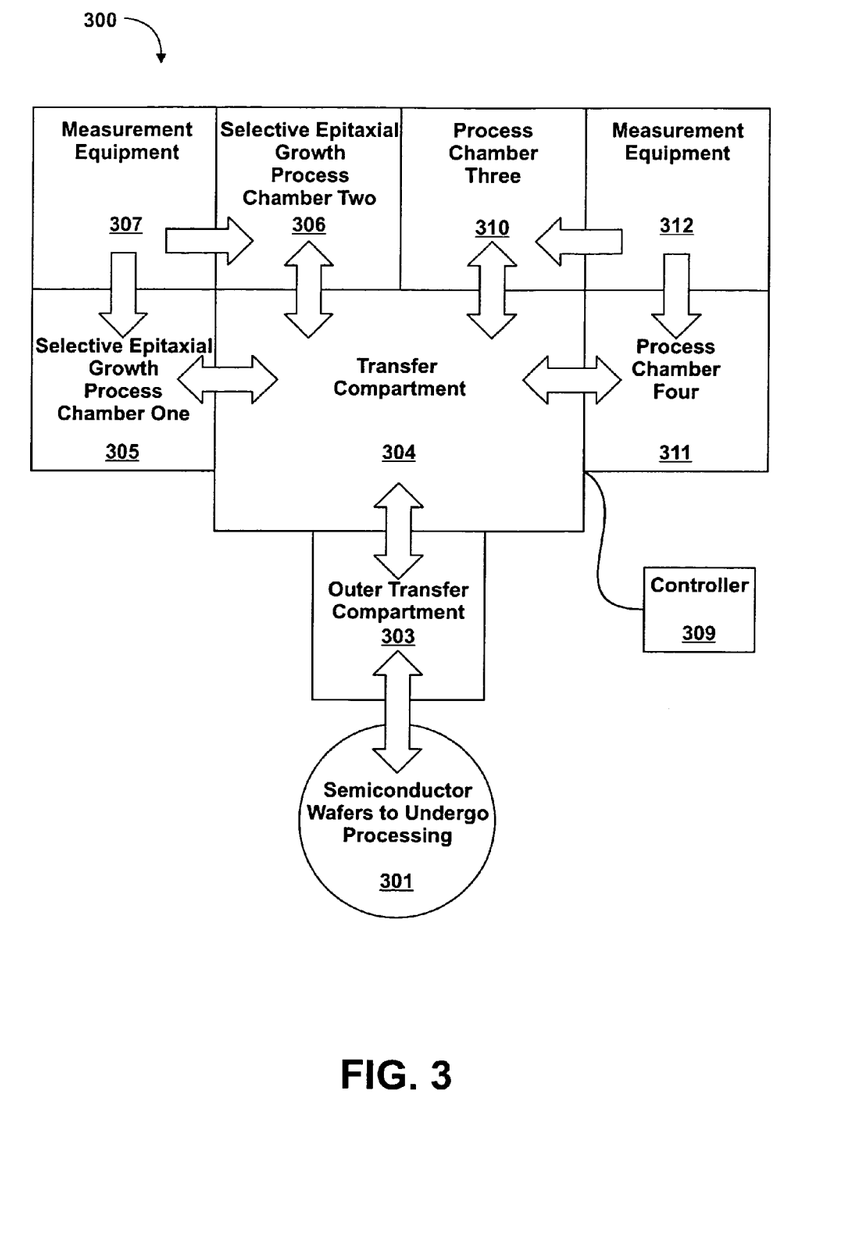
FIG. 3 is a simplified block diagram showing an alternate system for integrating optical ellipsometry equipment onto a multiple process platform according to at least one embodiment of the present disclosure.

FIG. 3 is a simplified block diagram illustrating a further example of a configuration for an integrated semiconductor device processing tool 300. The processing tool 300 represents a more complex system than those systems shown in FIGS. 1 and 2. Integrated processing tool 300 comprises an outer transfer compartment 303, an inter-chamber transfer compartment 304, a SEG process chamber 305, a SEG process chamber 306, a measurement equipment chamber 307, a measurement equipment chamber 312, a process chamber 310, a process chamber 311, and a controller 309. Controller 309 represents an information handling system which is interfaced to processing tool 300, and would comprise the components discussed with reference to FIGS. 1 and 2.

In the embodiment illustrated in FIG. 3, the measurement equipment 307 and/or the measurement equipment 312 can be configured to conduct in-situ measurements for their respective adjoining process chambers. In this manner, the wafers do not need to be transferred from their processing chambers to be measured. For example, the measurement equipment 307 can comprise an optical ellipsometer to measure a thickness of an epitaxial layer grown in SEG process chamber 305 (in-situ) or SEG process chamber 306 (in-situ) during the SEG process. Process chambers 310 and 311 can be additional SEG process chambers, with measurement equipment 312 being another optical ellipsometer for in-situ epitaxial layer growth monitoring. Alternatively, process chambers 310 and 311 may be other types of process chambers, e.g., a rapid thermal anneal (RTA) chamber, and measurement equipment chamber 312 for another type of measurement equipment, e.g., spectroscopic reflectometry.

In embodiments wherein the measurement equipment in measurement equipment 307 is an optical ellipsometer measuring the growth of the epitaxial layer during the SEG process, i.e., in situ, the program of instructions for controller 309 includes instructions to halt the selective epitaxial growth process when the thickness of the epitaxial layer is substantially equal to the desired thickness. For example, measurement data obtained from the controller 309 as provided by measurement equipment 307 can serve to evaluate a semiconductor manufacturing process based on in-situ measurements of the thickness of the epitaxial layer growing in SEG chamber 305 and/or SEG chamber 306. This information can be employed in advanced process controls to automate the adjustment of SEG parameters during the SEG process.

The systems shown in FIGS. 1 through 3 range from the simple to the more complex. The flexibility of the present disclosure permits configurations wherein the steps of initiating an epitaxial growth process, monitoring the epitaxial growth process, determining the thickness of the epitaxial layer at a plurality of locations, as well as concluding the epitaxial growth process based upon monitoring can be conducted in a single process chamber. Alternately, initiating, monitoring, determining, and concluding can be conducted in a separate process chamber. The selection of single or separate would be dependent upon the needs of the manufacturing facility. Regardless of the configuration selected, however, the environment of the various process chambers and measurement chambers should be maintained at the same low pressure as that of the SEG process chamber.

Figure 4:
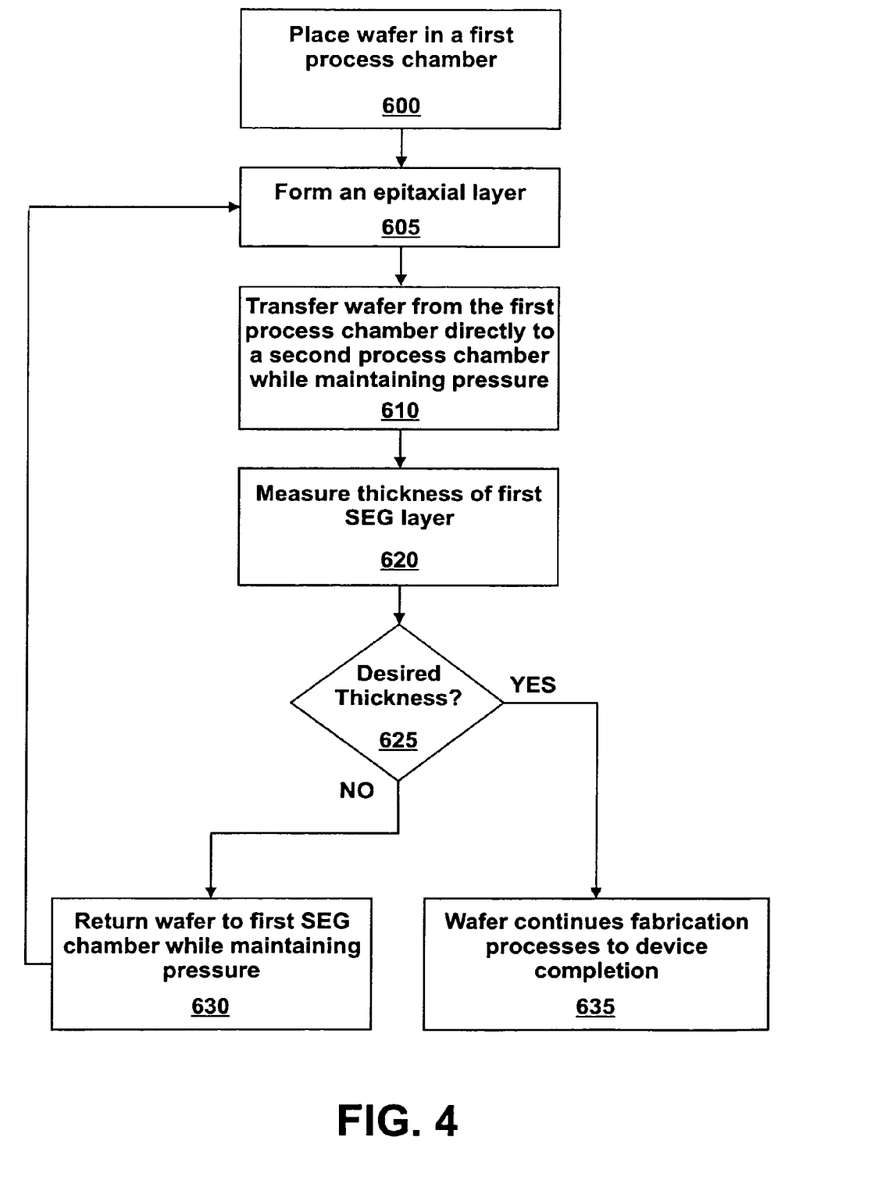
FIG. 4 is a flowchart illustrating a method for measuring the thickness of an epitaxial layer in an integrated system for semiconductor wafer fabrication according to at least one embodiment of the present disclosure.

FIG. 4 is a flowchart illustrating a method for measuring the thickness of an epitaxial layer in an integrated system for semiconductor device fabrication. In step 600, a semiconductor device, e.g., wafer or substrate, is placed in a first process chamber, e.g., an SEG process chamber. An epitaxial growth process is initiated to form a first epitaxial layer on the semiconductor device in step 605. In step 610, the wafer is transferred from the SEG process chamber directly to a second process chamber, where thickness measurements are conducted on the first epitaxial layer at a plurality of locations, as in step 620. Transferring includes removing the wafer from one location and placing the wafer in another location. During transfer, substantially the same pressure is maintained from one process chamber to another process chamber. In an embodiment, the low-pressure atmosphere is in the range of $1 \times 10^{-6}$ to $1 \times 10^{-10}$ Torr. Large pressure differentials between chambers should be avoided due to vacuum management concerns as well as wafer integrity considerations. The thickness measurements are conducted utilizing optical ellipsometry.

In step 625, a determination is made as to whether the measured thickness meets a desired thickness. If the desired thickness has been reached, the wafer continues other fabrication processes toward device completion, as in step 635. If the desired thickness has not been reached, in step 630 the wafer is returned directly to the SEG process chamber for additional epitaxial layer growth while maintaining substantially the same pressure during the transfer, and the process recommences from steps 605 through steps 625 until the desired thickness is achieved.

Figure 5:
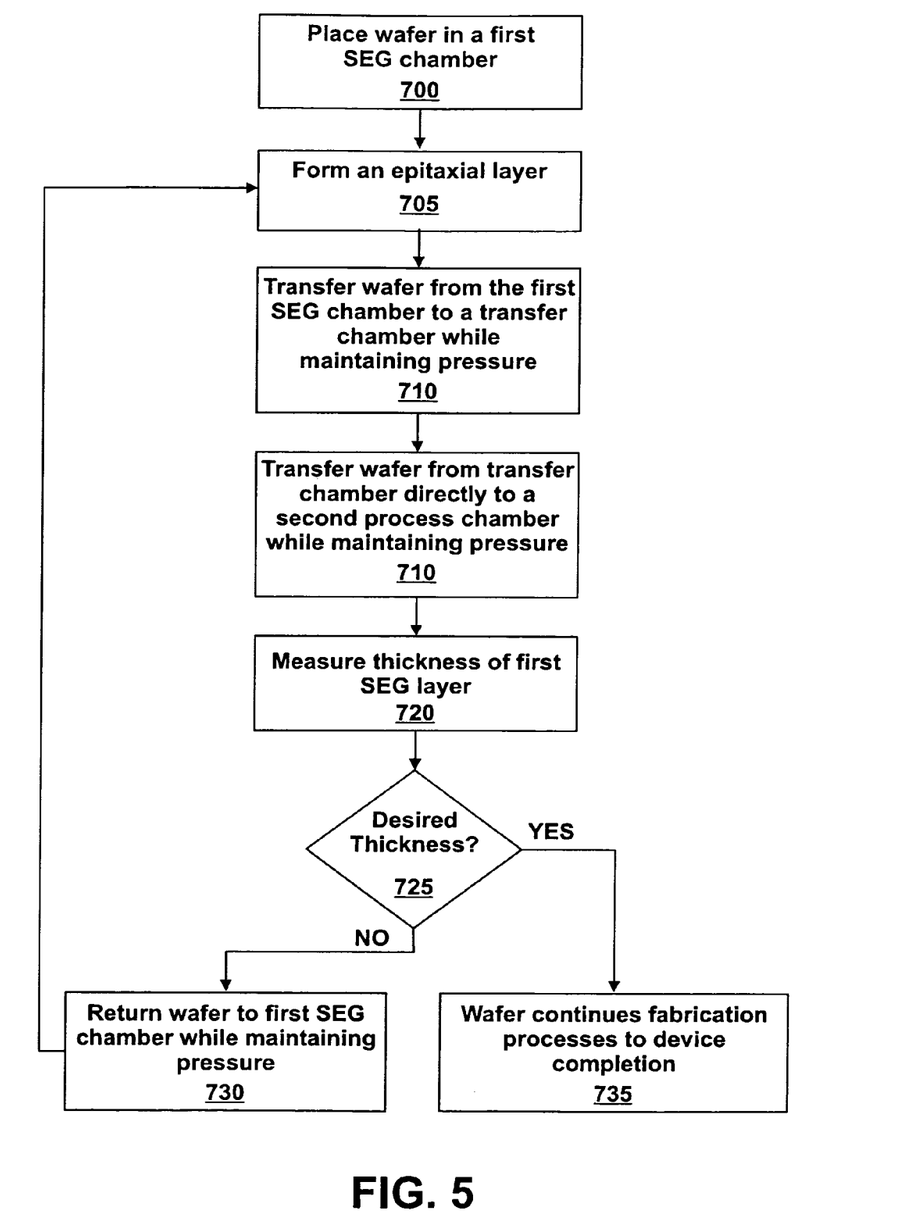
FIG. 5 is a flowchart illustrating another method for measuring the thickness of an epitaxial layer in an integrated system for semiconductor wafer fabrication according to at least one embodiment of the present disclosure.

FIG. 5 is a flowchart illustrating another method for measuring the thickness of an epitaxial layer in an integrated system for semiconductor wafer fabrication. In step 700, a semiconductor device, e.g., wafer or substrate, is placed in a first SEG process chamber. In step 705 an epitaxial growth process is initiated to form a first epitaxial layer on the semiconductor wafer. In step 710, the wafer is removed from the SEG process chamber to a transfer chamber, and in step 715, the wafer is conveyed from the transfer chamber and placed in a second process chamber. During the various transfers (removing and placing), the pressure is maintained at substantially the same (low) pressure throughout the various chambers and transfer compartment. In the second process chamber, thickness measurements are conducted on the first epitaxial layer at a plurality of locations, as in step 720. The thickness measurements are conducted utilizing optical ellipsometry.

In step 725, a determination is made as to whether the measured thickness of the first epitaxial layer meets a desired thickness. If measurements determine the desired thickness has been reached, the wafer is removed from the second chamber and continues other fabrication processes toward device completion, as in step 735. If the desired thickness has not been reached, in step 730 the wafer is returned, via the transfer compartment, to the SEG process chamber for additional epitaxial layer growth. The process continues from steps 705 through steps 725 until the desired thickness is achieved. As previously noted, each of the movements (removing and placing) between the process chamber(s) and the measurement chamber(s) occur at substantially the same pressure.

Figure 6:
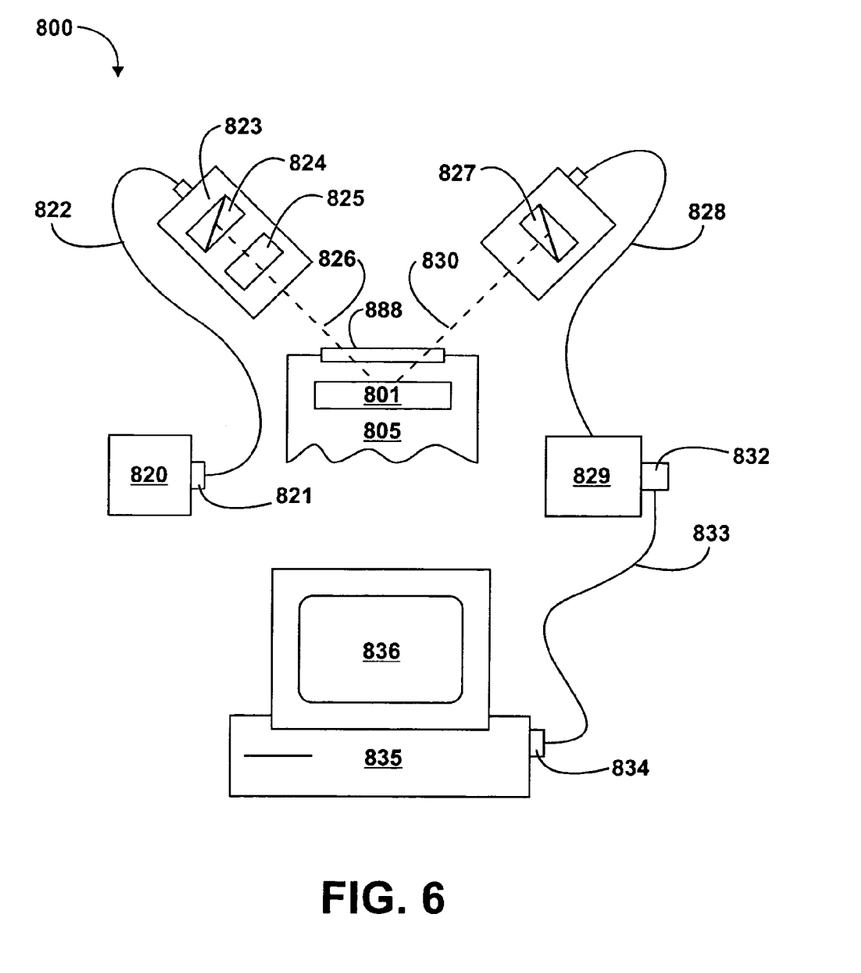
FIG. 6 is a block diagram illustrating a system for conducting in-situ optical ellipsometry for monitoring and/or controlling a selected epitaxial growth process according to at least one embodiment of the present disclosure.

FIG. 6 is a simplified block diagram illustrating a system 800 for conducting optical ellipsometry in-situ to an SEG process chamber for monitoring and/or controlling a selected epitaxial growth process according to an embodiment of the present disclosure. It should be noted that there are commercially available types of ellipsometers having various set-up configurations that can be utilized to practice the methods disclosed herein. Examples of these various configurations include rotating analyzer ellipsometers, rotating compensator ellipsometers, rotating polarizing ellipsometers, and polarization modulation ellipsometers, to name a few. Although there are differences in the various configurations, all of the various ellipsometers start with a light source and end with a detector. One example of an optical ellipsometry configuration which can be used to practice the methods taught herein is shown in FIG. 6.

In the example illustrated by FIG. 6, the system comprises a light source 820 and shutter 821 connected via an optical fiber 822 to an assembly 823 which houses a polarizer 824 and a photoelastic modulator 825. The light source can be a xenon, deuterium, quartz tungsten halogen, silicon carbide globar, or other type of lamp, in order to produce photons suitable to the spectral range/wavelength of interest. Typically, discrete wavelengths of 248 nm, 543 nm, 612 nm, or 1150 nm are used. A standard wavelength utilizes a HeNe laser at 632.8 nm. Additionally infrared sources at 0.83, 1.31, and 1.52 micron are available. The shutter 821 serves to eliminate background radiation from the environment, e.g., radiation produced by chamber wall heaters, sample heaters, and the like. The polarizer 824 and modulator 825 are mounted in the incident light path 826, and motors (not shown) permit the incident light path 826 to direct the photons at an angle operable for use in acquiring optical ellipsometry measurements.

The analyzer 827 is mounted to permit focus/spatial resolution of the light path 826 on a small area of the wafer 801 in the SEG chamber 805. The assorted components of optical ellipsometry system 800 are not physically located within the SEG chamber 805, but rather exterior to the SEG chamber 805. SEG chamber 805 has a port 888 in the SEG chamber 805 wall through which the ellipsometry measurements are conducted. The energy of the reflected beam 830 is appraised by the monochromator 829 or spectrograph, and the detector 832 measures the intensity of the light 830 passing through the analyzer 827. Although FIG. 6 illustrates a monochromator 829, there are array-based ellipsometers which could be employed instead. The measurements signal 833 from the detector 832 is sent to a communications port 834 which is part of a signal processing and information handling system 835. The detector 832 can be chosen from varieties known in the art, e.g., photodiode, photomultiplier, CCD array, diode array, et cetera. The selection of detector 832 should be optimized for the spectral ranges of interest.

The information handling system 835 further includes a processor, memory operably coupled to the processor, and a program of instructions to be stored in memory and executed by the processor. The program of instructions includes instructions to compare the measured thickness of the epitaxial layer against a desired thickness. In addition, instructions to halt or conclude the selective epitaxial growth process when the thickness of the epitaxial layer is substantially equal to the desired thickness are included, thus making the system suitable for process control. A video display terminal 836 is available for producing analysis images of the measurement data received from detector 832. A keyboard or keypad (not illustrated) is generally included for user input.

The system illustrated in FIG. 6 can be utilized to initiate a selective epitaxial growth (SEG) process to form an epitaxial layer on a semiconductor device 801. The thickness of the epitaxial layer during the SEG process is monitored by the optical ellipsometry equipment during the SEG process. In an embodiment, the SEG process can be adjusted based upon the monitoring results. The information handling system 835 determines when the measured thickness meets a desired thickness, and concludes the SEG process upon reaching the desired thickness.

In a particular embodiment, the steps of initiating, monitoring, determining, and concluding are conducted in a single process chamber. In another embodiment, the steps of measuring, determining, and concluding are conducted in a separate process chamber.

The method and system herein provides for a flexible implementation. Although described using certain specific examples, it will be apparent to those skilled in the art that the examples are illustrative, and that many variations exist. For example, the disclosure is discussed herein primarily with regard to monitoring and control of the thickness of an epitaxial layer for a CMOS device, however, the invention can be employed with other device technologies to determine thickness of other film layers during device manufacture. Additionally, various types of ellipsometry and selective epitaxial growth devices are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method comprising:
   placing a semiconductor substrate in a first process chamber of a process tool;
   forming a first epitaxial layer while in the first process chamber;
   removing the semiconductor substrate from the first process chamber;
   placing the semiconductor substrate in a second process chamber of the process tool; and;
   measuring a thickness of the first epitaxial layer while in the second process chamber;
   comparing the thickness of the first epitaxial layer to a desired thickness; and
   returning the semiconductor substrate to the first process chamber when the desired thickness is greater than the thickness of the first epitaxial layer.

2. The method of claim 1, further comprising:
   comparing the thickness of the first epitaxial layer to a desired thickness; and
   returning the semiconductor substrate to the first process chamber when the desired thickness is less than the thickness of the first epitaxial layer.

3. The method of claim 2, wherein no cleaning of the semiconductor substrate is required between placing the semiconductor substrate in the second process chamber, and returning the semiconductor substrate to the first process chamber prior to returning.

4. The method of claim 1, further comprising:
   evaluating a semiconductor manufacturing process based on the thickness of the first epitaxial layer.

5. The method of claim 1, further comprising:
   forming a second epitaxial layer on the first epitaxial layer while in the first process chamber after returning.

6. The method of claim 1, wherein measuring and comparing are performed for a plurality of locations of the first epitaxial layer.

7. The method of claim 1, wherein measuring is conducted with an optical ellipsometer.

8. The method of claim 1, wherein a low-pressure atmosphere is maintained at the semiconductor substrate during the steps of forming the first epitaxial layer, removing, and placing in the second process chamber.

9. The method of claim 1, wherein a low-pressure atmosphere is maintained during returning.

10. The method of claim 9, wherein the low-pressure atmosphere is in the range of $1 \times 10^{-6}$ to $1 \times 10^{-10}$ Torr.

11. A semiconductor device processing tool comprising:
    a measurement chamber to measure a thickness of an epitaxial layer;
    an epitaxial growth process chamber; and
    a transfer compartment to convey semiconductor wafers between the epitaxial growth process chamber and the measurement chamber, operable to maintain a pressure in the transfer compartment at substantially the same pressure in the epitaxial growth process chamber during processing.

12. The processing tool of claim 11, wherein the measurement chamber comprises an optical ellipsometer to measure a thickness of an epitaxial layer.

\* \* \* \* \*